United States Patent
Kidoguchi

(10) Patent No.: US 10,834,821 B2
(45) Date of Patent: Nov. 10, 2020

(54) ELECTRONIC CIRCUIT MODULE

(71) Applicant: Murata Manufacturing Co., Ltd., Nagaokakyo (JP)

(72) Inventor: Mitsuaki Kidoguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 33 days.

(21) Appl. No.: 15/809,194

(22) Filed: Nov. 10, 2017

(65) Prior Publication Data
US 2018/0077802 A1 Mar. 15, 2018

Related U.S. Application Data

(63) Continuation of application No. PCT/JP2016/058761, filed on Mar. 18, 2016.

(30) Foreign Application Priority Data

May 14, 2015 (JP) .................. 2015-098664

(51) Int. Cl.
*H05K 1/18* (2006.01)
*H01L 23/552* (2006.01)
(Continued)

(52) U.S. Cl.
CPC .......... *H05K 1/182* (2013.01); *H01L 23/544* (2013.01); *H01L 23/552* (2013.01);
(Continued)

(58) Field of Classification Search
CPC ..... H01L 21/156; H01L 21/56; H01L 21/561; H01L 23/36; H01L 23/544; H05K 1/141–144; H05K 1/181–188
(Continued)

(56) References Cited

U.S. PATENT DOCUMENTS 6,121,067 A * 9/2000 Canella .................. H01L 21/56
257/E21.502
6,372,819 B1 * 4/2002 Mizobuchi ............... B41M 5/24
427/181
(Continued)

FOREIGN PATENT DOCUMENTS

| JP | 2009-004584 A | 1/2009 |
| JP | 2012-039104 A | 2/2012 |
| JP | 2013-166811 A | 8/2013 |

OTHER PUBLICATIONS

Official Communication issued in International Patent Application No. PCT/JP2016/058761, dated Jun. 7, 2016.

*Primary Examiner* — Tuan T Dinh
(74) *Attorney, Agent, or Firm* — Keating & Bennett, LLP

(57) ABSTRACT

An electronic circuit module includes a circuit board, electronic components, a burying layer, and a conductive film. The circuit board includes a first principal surface on which first electrodes are provided, a second principal surface on which second electrodes including grounding electrodes are provided, and a side surface connecting the first principal surface and the second principal surface. The electronic components are connected to the first electrodes. The burying layer is provided on the first principal surface of the circuit board with the electronic components buried therein. The conductive film is connected to the grounding electrodes. The outer surface of the burying layer includes markings with protruding shapes with respect to the outer surface of the burying layer. The conductive film covers the outer surface of the burying layer.

6 Claims, 5 Drawing Sheets

(51) Int. Cl.
*H01L 23/544* (2006.01)
*H05K 1/02* (2006.01)
*H05K 1/03* (2006.01)
*H05K 1/09* (2006.01)
*H05K 1/11* (2006.01)
*H01L 23/31* (2006.01)
*H01L 23/29* (2006.01)
*H05K 3/28* (2006.01)

(52) U.S. Cl.
CPC ......... H05K 1/0266 (2013.01); H05K 1/0298 (2013.01); H05K 1/0306 (2013.01); H05K 1/0366 (2013.01); H05K 1/09 (2013.01); H05K 1/115 (2013.01); *H01L 23/295* (2013.01); *H01L 23/3121* (2013.01); *H01L 2223/54406* (2013.01); *H01L 2223/54433* (2013.01); *H01L 2223/54486* (2013.01); *H01L 2224/16227* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H05K 3/284* (2013.01); *H05K 2201/0715* (2013.01); *H05K 2201/09936* (2013.01)

(58) Field of Classification Search
USPC ........ 361/700–706, 760–764, 782–784, 803, 361/816, 818; 257/700–704
See application file for complete search history.

(56) References Cited

U.S. PATENT DOCUMENTS

| | | | | |
|---|---|---|---|---|
| 6,680,220 | B2* | 1/2004 | Minamio | H01L 21/561 257/E23.069 |
| 7,615,404 | B2* | 11/2009 | Loon | H01L 23/36 438/106 |
| 7,776,703 | B2* | 8/2010 | Fukuchi | H01L 23/544 257/E21.005 |
| 8,310,069 | B2* | 11/2012 | Ano | H01L 21/561 257/678 |
| 9,035,308 | B2* | 5/2015 | Yim | H01L 23/544 257/48 |
| 2008/0179761 | A1* | 7/2008 | Ano | B41J 3/407 257/797 |
| 2010/0247893 | A1* | 9/2010 | Zimmerman | C09K 11/02 428/292.1 |
| 2012/0015687 | A1 | 1/2012 | Yamada et al. | |

* cited by examiner

FIG. 3A
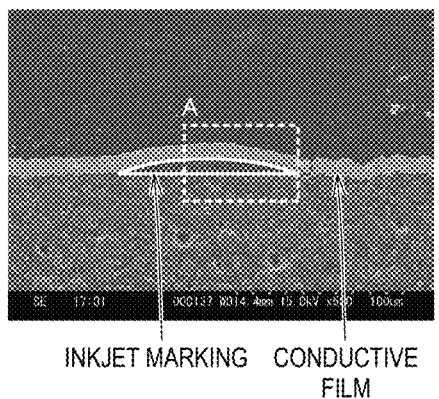
INKJET MARKING   CONDUCTIVE FILM
FIG. 3B
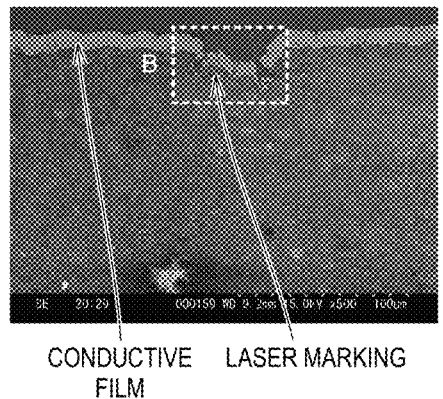
CONDUCTIVE FILM   LASER MARKING
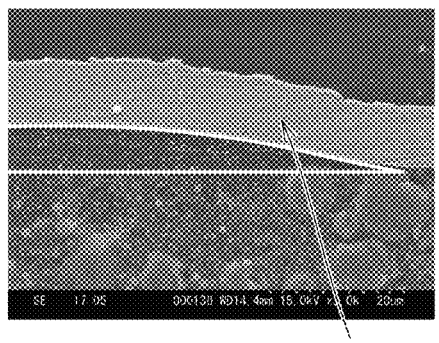
CONDUCTIVE FILM WITH GOOD CONTINUITY
FIG. 3C
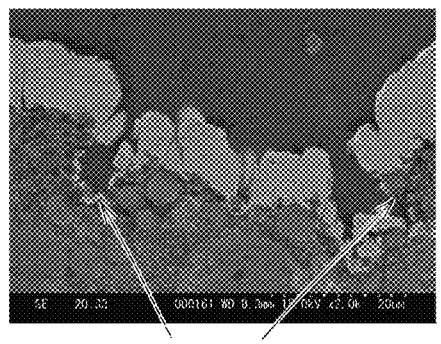
DISCONTINUOUS PARTS IN CONDUCTIVE FILM
FIG. 3D

ELECTRONIC CIRCUIT MODULE

CROSS REFERENCE TO RELATED APPLICATIONS

This application claims the benefit of priority to Japanese Patent Application No. 2015-098664 filed on May 14, 2015 and is a Continuation Application of PCT Application No. PCT/JP2016/058761 filed on Mar. 18, 2016. The entire contents of each application are hereby incorporated herein by reference.

BACKGROUND OF THE INVENTION

1. Field of the Invention

The present invention relates to electronic circuit modules each including connecting electronic components connected to a circuit board and buried in a burying layer including a surface covered with a conductive film.

2. Description of the Related Art

In recent years, to meet demands for higher performance and efficient manufacturing of electronic devices, it has become more popular to use electronic circuit modules each formed by connecting electronic components to a circuit board and burying the electronic components into a burying layer whose surface is coated with a conductive film. In Japanese Unexamined Patent Application Publication No. 2009-4584, an example of such an electronic circuit module is disclosed.

FIG. 7 is a cross sectional view of an electronic circuit module 300 described in Japanese Unexamined Patent Application Publication No. 2009-4584. In the electronic circuit module 300 described in FIG. 7, electronic components 303 and 304 are connected to circuit boards 301 and 302, respectively. The electronic component 303 is buried in an electrically insulating layer 305, and the electronic component 304 is buried in a burying layer 306. The circuit boards 301 and 302 are electrically connected by a via 307 and a via-receiving land 308.

On a surface of the burying layer 306, a conductive film 309 that serves as a shield layer is formed by means of one of plating, vapor deposition, sputtering, and CVD. The conductive film 309 is connected to a cut surface of a via 310, and is connected to a non-illustrated grounding electrode with the via 310 and the via-receiving land 308 interposed therebetween.

In such an electronic circuit module 300, in addition to shielding of the electronic circuit module itself, the shielding layer is able to be made much thinner. Thus, such an electronic circuit module 300 has the advantage of achieving further downsizing and thinning of the electronic circuit module.

In the foregoing electronic circuit module 300, after forming the conductive film 309 on the surface of the burying layer 306, markings of product information are made, for example, using a laser. In such a case, the marking may sometimes penetrate through thinner portions of the conductive film 309, and this may impair shielding capability. In a case where the conductive film 309 is formed on the burying layer 306 after forming, as the marking, a recess portion on the burying layer 306 using a laser, it is difficult to form the conductive film 309 inside the recess portion, particularly on a wall surface thereof. This may also impair the shielding capability.

SUMMARY OF THE INVENTION

Preferred embodiments of the present invention provide electronic circuit modules having a superior shielding capability even when markings are provided.

In preferred embodiments of the present invention, even when markings are provided, in order to obtain electronic circuit modules having superior shielding capability, the markings and a conductive film are improved.

An electronic circuit module according to a preferred embodiment of the present invention includes a circuit board, an electronic component, a burying layer, and a conductive film. The circuit board includes a first principal surface on which a first electrode is provided, a second principal surface on which second electrodes including a grounding electrode are provided, and a side surface connecting the first principal surface and the second principal surface. The electronic component is connected to the first electrode. The burying layer is provided on the first principal surface of the circuit board with the electronic component buried therein. The conductive film is connected to the grounding electrode. An outer surface of the burying layer includes a marking having a protruding shape with respect to the outer surface of the burying layer. Further, the conductive film covers the outer surface of the burying layer.

In the foregoing electronic circuit module, the marking has a protruding shape with respect to the outer surface of the burying layer, and the conductive film covers the outer surface of the burying layer. The marking having a protruding shape with respect to the surface of the burying layer has a flared-out cross-sectional shape, as illustrated in FIG. 1 and FIGS. 3A and 3C, which will be described later. Such marking is still sufficiently recognizable because a minute yet solid structure is provided even when the marking is covered with the conductive film.

Further, since the marking has a protruding shape, the conductive film covering the marking has excellent continuity and does not include discontinuities in a central portion thereof. Accordingly, superior shielding capability is obtained.

Preferably, the electronic circuit module according to a preferred embodiment of the present invention has the following characteristics. The marking is conductive. Further, the conductive film covers, together with the marking, the outer surface of the burying layer such that the marking is exposed.

In the foregoing electronic circuit module, the marking is conductive and is exposed at the conductive film. Further, the outer surface of the burying layer is covered with the conductive film and the marking. For example, the conductive marking is preferably formed by using black carbon ink. Alternatively, for example, by using Cu, the conductive film may be provided so as to expose the marking while maintaining contact with the marking. In other words, since the marking having a different color is exposed at the conductive film, the marking is readily recognizable.

Further, since the top portion of the marking is not covered with the conductive film, the profile height of the electronic circuit module is reduced by the thickness of the conductive film. Accordingly, in addition to superior shielding capability, a reduction of the profile height of the electronic circuit module is also achieved.

More preferably, an electronic circuit module according to a preferred embodiment of the present invention has the following characteristic. Specifically, the marking preferably is formed using a discharging device.

In the foregoing electronic circuit module, since the marking is formed using a discharging device, even a fine marking does not include any blurred portions, and thus, the marking is clearly and readily recognizable.

More preferably, a preferred embodiment of the electronic circuit module according to the present invention has the following characteristic. Specifically, the marking is formed using an ink jet device.

In the foregoing electronic circuit module, since the marking is formed using an ink jet device, even a fine complex marking does not include any blurred portions, and thus, the marking is clearly and readily recognizable.

More preferably, an electronic circuit module according to a preferred embodiment of the present invention has the following characteristic. Specifically, the conductive film is formed by at least one method selected from a group consisting of sputtering, metal plating, vapor deposition, and CVD.

In the foregoing electronic circuit module, the conductive film is formed using a thin film formation method, such as the ones listed above. Accordingly, it is possible to reduce the thickness of the conductive film. This enables a reduction of the profile height of the electronic circuit module.

In the electronic circuit modules according to various preferred embodiments of the present invention, the marking has a protruding shape with respect to the outer surface of the burying layer, and the conductive film covers the outer surface of the burying layer. The marking having the protruding shape with respect to the surface of the burying layer has a flared-out cross-sectional shape. According to such marking, even when the marking is covered with the conductive film, the marking is still sufficiently recognizable because a minute yet solid structure is provided.

Further, since the marking has a protruding shape, the conductive film covering the marking has excellent continuity and does not include and discontinuities in a central portion thereof. Accordingly, superior shielding capability is obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A and 3C are cross sectional photographs of an electronic circuit module corresponding to the electronic circuit module 100 illustrated in FIG. 1, and FIGS. 3B and 3D are cross sectional photographs of an electronic circuit module of a comparison example with a conductive film that is formed after making a marking on a burying layer by using laser.

DETAILED DESCRIPTION OF THE PREFERRED EMBODIMENTS

Preferred embodiments of the present invention will be described with reference to the drawings.

First Preferred Embodiment

An electronic circuit module 100 that is a first preferred embodiment of an electronic circuit module according to the present invention is described with reference to FIG. 1.

Figure 1:
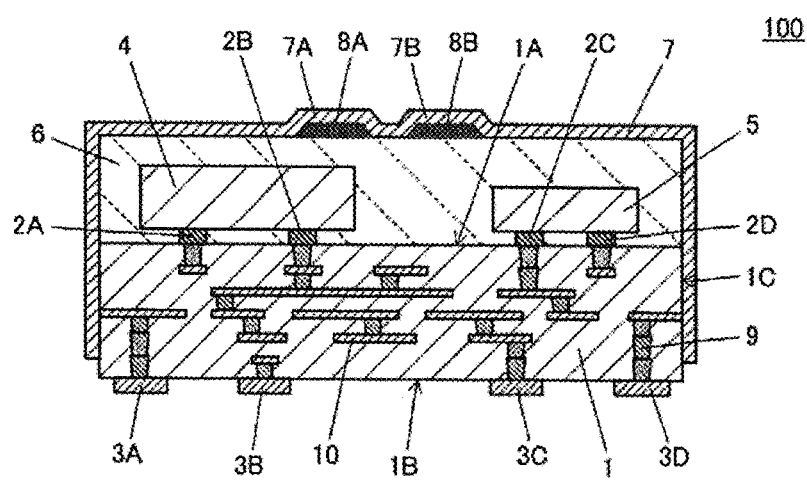
FIG. 1 is a cross sectional view of an electronic circuit module 100 according to a first preferred embodiment of the present invention.

FIG. 1 is a cross sectional view of the electronic circuit module 100. The electronic circuit module 100 includes a circuit board 1, electronic components 4 and 5, a burying layer 6, and a conductive film 7.

The circuit board 1 includes a first principal surface 1A on which first electrodes 2A to 2D are provided, a second principal surface 1B on which second electrodes 3A to 3D including grounding electrodes 3A and 3D are provided, and a side surface 1C connecting the first principal surface 1A and the second principal surface 1B. Further, the circuit board 1 includes internal conductors including via conductors 9 and pattern conductors 10. As the circuit board 1, it is preferable to use a multilayer substrate made of a matrix including a glass fiber enforced insulating resin material or a ceramic material or other suitable material, and in which circuit patterns each defined by conductors are provided on a surface and inside thereof.

The electronic component 4 is connected to the first electrodes 2A and 2B of the circuit board 1 by, for example, a non-illustrated bonding material, such as solder or other suitable bonding material. Similarly, the electronic component 5 is connected to the first electrodes 2C and 2D of the circuit board 1. The electronic components 4 and 5 are not limited to any particular type, and may be, for example, active components including semiconductor devices, such as integrated circuits, transistors, and other suitable components, or passive components including inductors, capacitors, resistors, and other suitable components.

The burying layer 6 is provided on the first principal surface 1A of the circuit board 1 with the electronic components 4 and 5 buried therein. The burying layer 6 is preferably a layer of an insulating resin material or a layer of an insulating resin material in which, for example, a glass material or silica or other suitable material is dispersed as filler.

Alternatively, a single insulating resin material without a filler may be used.

The conductive film 7 is connected to the grounding electrodes 3A and 3D of the circuit board 1 with the via conductor 9 and the pattern conductor 10, which are internal conductors of the circuit board 1, interposed therebetween.

In FIG. 1, the conductive film 7 is provided across an outer surface of the burying layer 6 including a side surface and a top surface thereof and a portion of the side surface 1C of the circuit board 1. Preferably, the conductive film 7 is formed by at least one method selected from a group consisting of sputtering, metal plating, vapor deposition, and CVD. Alternatively, the conductive film 7 may be a conductive resin film in which metal filler is dispersed inside a resin matrix.

The outer surface of the burying layer 6 includes markings 8A and 8B formed by, for example, an ink jet device, and the markings 8A and 8B preferably have protruding shapes with respect to the surface of the burying layer 6. The markings 8A and 8B indicate product information of the electronic circuit module 100. The markings 8A and 8B may be conductive or non-conductive. The conductive film 7 covers the outer surface of the burying layer 6 including the markings 8A and 8B.

The formation method of the markings 8A and 8B may be performed using a discharging device other than an ink jet device, such as, for example, a dispenser or other suitable device as long as such discharging device is able to form the markings 8A and 8B such that the markings 8A and 8B have protruding shapes with respect to the surface of the burying layer 6. In a case where the discharging device is used to form the markings, even a fine marking does not include any blurred portions, and thus, the markings are clearly and readily recognizable. Particularly, in a case where the ink jet device is used to form the markings, even a fine complex marking does not include any blurred portion, and thus, the markings are clearly and readily recognizable.

Alternatively, instead of the discharging device, a printing device may be used to form the markings 8A and 8B having protruding shapes with respect to the surface of the burying layer 6.

The markings 8A and 8B formed by the foregoing formation method have protruding shapes with respect to the surface of the burying layer, and each of the protruding shapes preferably includes a flared-out cross-sectional shape, for example. Accordingly, even when the markings 8A and 8B are covered with the conductive film 7, minute yet solid structures 7A and 7B are provided. Thus, such structures 7A and 7B are recognizable as markings.

Further, since the markings 8A and 8B have the protruding and flared-out shapes, the conductive film 7 covering the markings 8A and 8B has excellent continuity and does not include discontinuities in a central portion thereof. Accordingly, even in the case where the markings 8A and 8B are provided, superior shielding capability is obtained.

Figure 2A:
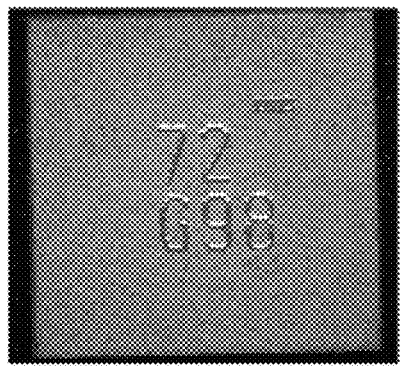
FIG. 2A is a top exterior photograph of an electronic circuit module corresponding to the electronic circuit module 100 illustrated in FIG. 1.
Figure 2B:
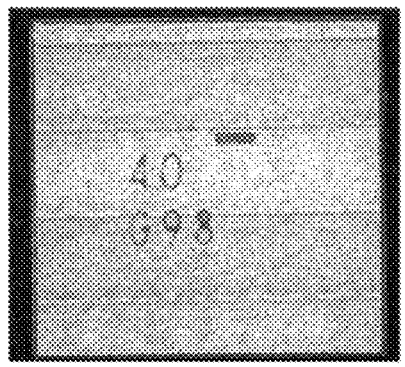
FIG. 2B is a top exterior photograph of an electronic circuit module of a comparison example whose conductive film is formed after forming a marking on a burying layer using a laser.

The foregoing characteristics of the electronic circuit module according to a preferred embodiment of the present invention are further described with reference to FIGS. 2A, 2B and FIGS. 3A to 3D. FIG. 2A is a top exterior photograph of an electronic circuit module corresponding to the electronic circuit module 100. FIG. 2B is a top exterior photograph of an electronic circuit module of a comparison example whose conductive film is formed after forming markings having recessed shapes on a burying layer using a laser. FIG. 3A is a cross sectional photograph of the electronic circuit module illustrated in FIG. 2A, and FIG. 3C is an enlarged view of a dotted line portion A in FIG. 3A. FIG. 3B is a cross sectional photograph of the electronic circuit module illustrated in FIG. 2B, and FIG. 3D is an enlarged view of a dotted line portion B in FIG. 3B.

FIGS. 2A and 2B were observed under oblique lighting. In such a case, the markings on the electronic circuit module according to a preferred embodiment of the present invention are clearly and readily recognized compared to the markings made using a laser. This is because the marking portion illustrated in FIG. 2A has a solid structure, which is formed by forming markings so as to have a protruding shape with respect to the surface of the burying layer using an ink jet device and by covering the marking with a conductive film. Further, in this case, the marking portion covered by the conductive film becomes slightly larger than the marking formed by the ink jet device. Such a solid structure includes a portion that reflects light and a portion that creates a shadow when observed under oblique lighting, thus facilitating recognition of the marking.

Further, when FIGS. 3A and 3C are compared with FIG. 3B and FIG. 3D, it becomes clear that a conductive film of an electronic circuit module according to a preferred embodiment of the present invention has superior continuity, compared with the conductive film of the electronic circuit module in which a laser is used to form the markings. The markings formed by the ink jet device each have a protruding shape with respect to the surface of the burying layer and have a flared-out cross-sectional shape. Since the conductive film covers such markings, the conductive film is formed so as to follow the shapes of the markings, and thus, there are no discontinuities in a central portion thereof. In other words, even when the markings are provided, superior shielding is obtained.

On the other hand, the markings formed by a laser have recessed shapes with respect to the surface of the burying layer at cross section. It is difficult to form a conductive film on a wall surface of such recess-shaped markings by sputtering or other suitable method, and, as it is clear from FIG. 3D, discontinuities of the conductive film were formed at the wall surface of the recess-shaped markings. In other words, the inclusion of the markings degrades the shielding. Accordingly, in the first preferred embodiment of the electronic circuit module according to the present invention, superior shielding capability is obtained.

A non-limiting example of a manufacturing method of the electronic circuit module 100 illustrated in FIG. 1 is described with reference to FIGS. 4A to 4C. Note that descriptions of processes from preparation of the circuit board 1 to connection of the electronic components 4 and 5 to the first electrodes 2A to 2D are omitted.

Figure 4A:
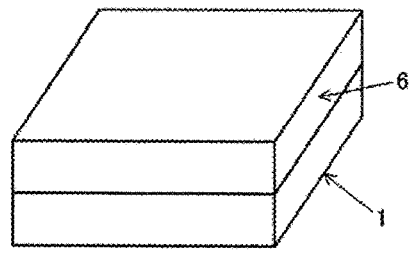
FIGS. 4A to 4C are diagrams for describing an example of a manufacturing method of the electronic circuit module 100 illustrated in FIG. 1, and are perspective views schematically illustrating a burying layer formation process, a marking forming process, and a conductive film formation process, respectively.

FIG. 4A is a perspective view schematically illustrating a burying layer formation process in the manufacturing method of the electronic circuit module 100. With the burying layer formation process, the burying layer 6, in which the electronic components 4 and 5 (non-illustrated) are buried, is formed on the first principal surface 1A (non-illustrated) of the circuit board 1. Note that this burying layer formation process may be performed in a state of multi-piece substrate, which is a collective structure of circuit boards 1. In other words, a circuit board 1 on which the burying layer 6 is formed may be obtained by forming a collective-state burying layer on a first principal surface of the multi-piece substrate and, subsequently, cutting it into individual pieces with, for example, a dicing saw or other suitable cutting device.

Figure 4B:
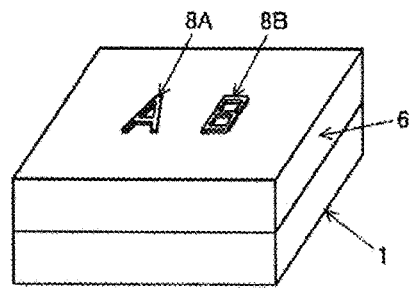

FIG. 4B is a perspective view schematically illustrating a marking forming process in the manufacturing method of the electronic circuit module 100. In the marking forming process of the present preferred embodiment, the markings 8A and 8B are preferably formed on the top surface of the burying layer 6 by an ink jet device. These markings 8A and 8B preferably have a flared-out cross-sectional shape as illustrated in FIGS. 3A and 3C. Further, as described above, the formation method of the markings 8A and 8B may use a method that enables formation of the markings 8A and 8B such that the markings 8A and 8B preferably have protruding shapes with respect to the surface of the burying layer 6.

Alternatively, this marking forming process may be performed in a state in which the collective-state burying layer is formed on the first principal surface of the multi-piece substrate. Subsequently, as described above, a circuit board 1 including the burying layer 6 on which the markings 8A and 8B have been formed may be obtained.

Figure 4C:
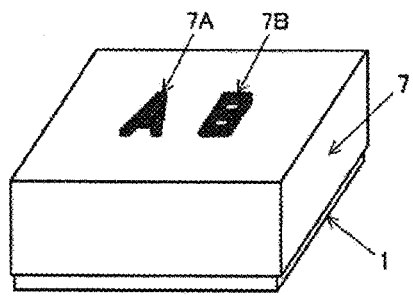

FIG. 4C is a perspective view schematically illustrating a conductive film formation process in the manufacturing method of the electronic circuit module 100. Preferably, the conductive film 7 is formed by at least one method selected from a group consisting of sputtering, metal plating, vapor deposition, and CVD, for example. The material of the conductive film 7 is not particularly limited, and may be selected as appropriate in consideration of points, such as a level of conductivity, ease of formation, cost, and other relevant factors. Alternatively, a plurality of conductive films may be sequentially formed. With the conductive film formation process, the conductive film 7 is formed to cover the outer surface of the burying layer 6 including the markings 8A and 8B. According to the manufacturing method described above, minute yet recognizable solid structures 7A and 7B are formed while maintaining the continuity of the conductive film 7.

Second Preferred Embodiment

An electronic circuit module 200 that is a second preferred embodiment of electronic circuit module according to the present invention is described with reference to FIG. 5.

As to duplicate elements of the electronic circuit module 100 illustrated in FIG. 1, a description thereof is omitted if appropriate.

Figure 5:
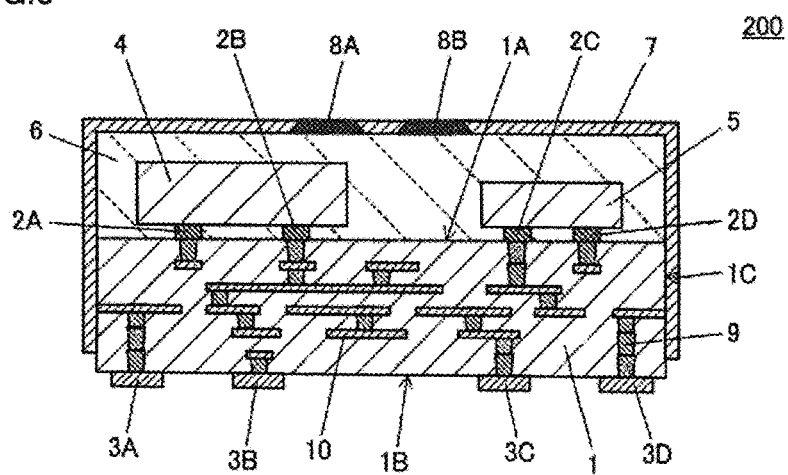
FIG. 5 is a cross sectional view of an electronic circuit module 200 according to a second preferred embodiment of the present invention.

FIG. 5 is a cross sectional view of the electronic circuit module 200. The electronic circuit module 200 includes conductive markings 8A and 8B provided by, for example, an ink jet device using carbon ink, and the conductive markings 8A and 8B preferably have protruding shapes with respect to the surface of the burying layer 6. Further, the markings 8A and 8B are exposed at the conductive film 7 at their top portions while maintaining contact with the conductive film 7.

In other words, in the electronic circuit module 200, the outer surface of the burying layer 6 is covered with the conductive film 7 and the conductive markings 8A and 8B. In this case, although the solid structures 7A and 7B are not provided as in the electronic circuit module 100, the markings 8A and 8B having a different color are exposed at the conductive film 7. This makes the markings 8A and 8B readily recognizable. As in the first preferred embodiment, the formation method of the markings 8A and 8B may use a method that enables formation of the markings 8A and 8B such that the markings 8A and 8B have protruding shapes with respect to the surface of the burying layer 6.

Further, the top portions of the markings 8A and 8B are not covered with the conductive film 7. Thus, a profile height of the electronic circuit module 200 is reduced by the thickness of the conductive film 7. Accordingly, the second preferred embodiment of the electronic circuit module according to the present invention enables achievement of a low profile height of the electronic circuit module, in addition to the superior shielding capability. Although, in FIG. 5, the markings 8A and 8B are illustrated such that the top surfaces of the markings 8A and 8B and the top surface of the conductive film 7 are at the same or substantially the same height, the heights of the respective top surfaces may vary from each other.

A non-limiting example of a manufacturing method of the electronic circuit module 200 illustrated in FIG. 5 is described with reference to FIGS. 6A to 6D. Note that processes up to a conductive film formation process (FIG. 6C) are similar to those in the foregoing example of the manufacturing method of the electronic circuit module 100, except a conductive ink is used during the formation by ink jet in a marking forming process (FIG. 6B), and thus, descriptions of those processes are omitted.

Figure 6A:
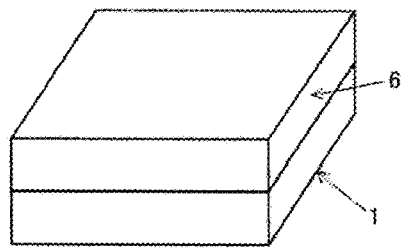
FIGS. 6A to 6D are diagrams for describing an example of a manufacturing method of the electronic circuit module 200 illustrated in FIG. 5, and are perspective views schematically illustrating a burying layer formation process, a marking forming process, a conductive film formation process, and a marking exposing process, respectively.
Figure 6B:
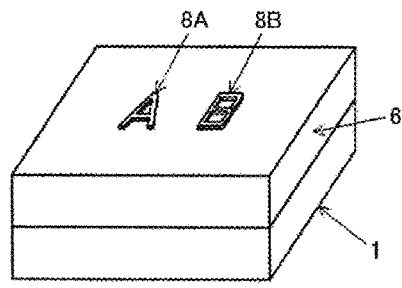
Figure 6C:
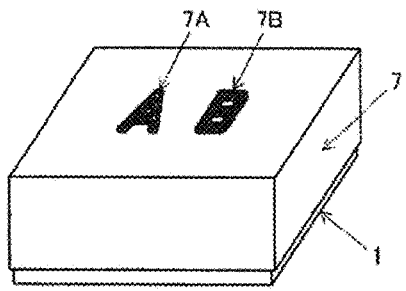
Figure 6D:
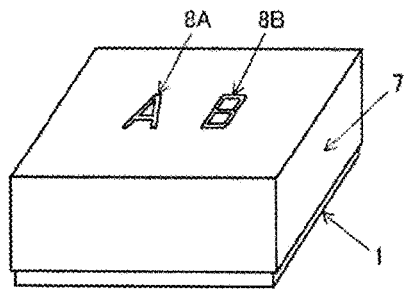
Figure 7:
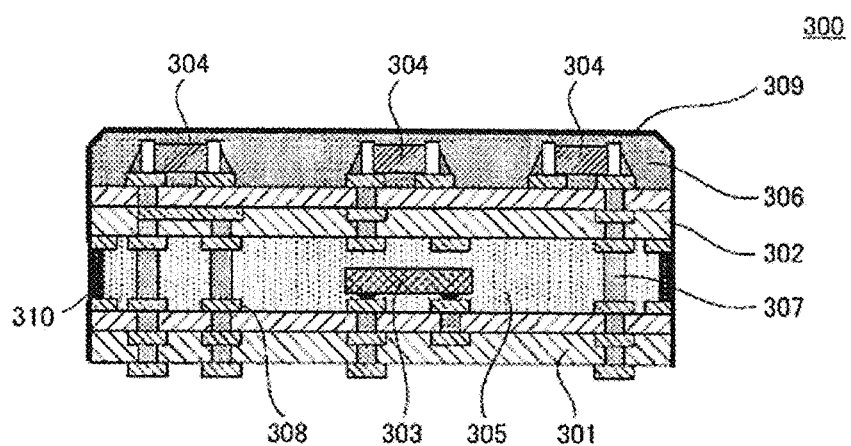
FIG. 7 is a cross sectional view of an electronic circuit module 300 of Background Art.

FIG. 6D is a perspective view schematically illustrating a marking exposing process in the manufacturing method of the electronic circuit module 200. In this process, the conductive film 7 (solid structures 7A and 7B), which is formed by the conductive film formation process illustrated in FIG. 6C, covering top portions of the conductive markings 8A and 8B is removed, and the top portions of the markings 8A and 8B are exposed. In the removal of the conductive film 7, a method such as, but is not limited to, surface grinding or blast processing may preferably be used. According to the manufacturing method described above, the outer surface of the burying layer 6 is covered with the conductive film 7 and the conductive markings 8A and 8B. As a result, both superior shielding capability and a low profile height of the electronic circuit module are achieved.

Note that the present invention is not limited to the preferred embodiments described above, and that various applications and modifications may be made within the scope of the present invention. In other words, the present invention is applicable to any electronic circuit module including electronic components connected to a circuit board and buried within a burying layer whose surface is covered with a conductive film. For example, the number and type of the electronic components, configuration of the circuit board, formation state of the conductive film, and the number and type of markings may be varied as appropriate depending on the product information and functions desirable for the electronic circuit module.

Although preferred embodiments of the present invention have been described as above, it is to be understood that the preferred embodiments described in the present disclosure are exemplary in all aspects and are not restrictive. It is intended that the scope of the present invention be determined by the claims and includes all variations which come within the meaning and range of equivalency of the claims.

Electronic circuit modules are provided which have superior shielding capability even when markings are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic circuit module comprising:
   a multilayer circuit board including a first principal surface on which a first electrode is provided, a second principal surface on which second electrodes including a grounding electrode are provided, a side surface connecting the first principal surface and the second principal surface, and internal conductors including a via conductor and a pattern conductor;
   an electronic component connected to the first electrode;

a burying layer provided on the first principal surface of the circuit board with the electronic component buried therein; and a conductive film connected to the grounding electrode by the via conductor and the pattern conductor; wherein an outer surface of the burying layer includes a marking including a protruding shape that protrudes with respect to an outer surface of the burying layer, and the conductive film completely covers the marking and the outer surface of the burying layer; and the circuit board is made of a matrix including a glass fiber enforced insulating resin material or a ceramic material.

2. The electronic circuit module according to claim 1, wherein the marking is provided using a discharging device.

3. The electronic circuit module according to claim 1, wherein the conductive film is provided by at least one method selected from a group consisting of sputtering, metal plating, vapor deposition, and CVD.

4. The electronic circuit module according to claim 1, wherein the burying layer is made of an insulating resin material.

5. The electronic circuit module according to claim 1, wherein the marking has a flared-out cross-sectional shape.

6. The electronic circuit module according to claim 2, wherein the marking is provided using an ink jet device.

\* \* \* \* \*